(12) United States Patent
Merritt

(10) Patent No.: US 6,259,270 B1
(45) Date of Patent: Jul. 10, 2001

(54) SEMICONDUCTOR PROGRAMMABLE TEST ARRANGEMENT SUCH AS AN ANTIFUSE ID CIRCUIT HAVING COMMON PROGRAMMING SWITCHES

(75) Inventor: Todd A. Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/651,332

(22) Filed: Aug. 31, 2000

Related U.S. Application Data

(63) Continuation of application No. 08/695,590, filed on Aug. 12, 1996.

(51) Int. Cl.$^7$ ............................................. H03K 19/173
(52) U.S. Cl. ............................ 326/38; 326/37; 327/525
(58) Field of Search ............................... 326/10, 16, 37, 326/38; 327/525, 526

(56) References Cited

U.S. PATENT DOCUMENTS

| | | | |
|---|---|---|---|
| Re. 36,952 | * 11/2000 | Zagar et al. ............................ | 326/44 |
| 4,689,494 | 8/1987 | Chen et al. . | |
| 5,099,149 | 3/1992 | Smith . | |
| 5,293,339 | 3/1994 | Suzuki et al. . | |
| 5,418,487 | 5/1995 | Armstrong, II . | |
| 5,446,402 | 8/1995 | Yoshimori . | |
| 5,654,649 | * 8/1997 | Chua ..................................... | 326/38 |
| 5,661,323 | 8/1997 | Choi et al. . | |
| 5,945,840 | * 8/1999 | Cowles et al. ......................... | 326/38 |
| 6,028,444 | * 2/2000 | Wong et al. ........................... | 326/38 |
| 6,127,845 | * 10/2000 | Kolze et al. ........................... | 326/41 |
| 6,133,778 | * 10/2000 | Kim et al. ............................. | 327/525 |

* cited by examiner

Primary Examiner—Michael Tokar
Assistant Examiner—Vibol Tan
(74) Attorney, Agent, or Firm—Dickstein Shapiro Morin & Oshinsky LLP

(57) ABSTRACT

A semiconductor integrated circuit includes a plurality of programmable elements, each having a first terminal connected to a first power supply potential, and a second terminal. Each of a plurality of first semiconductor switching elements has a first terminal respectively connected to the second terminal of a corresponding one of the plurality of programmable elements and has a second terminal. Each of a plurality of second semiconductor switching elements has a first terminal connected in common to selected ones of the second terminals of the plurality of first semiconductor switching elements and has a second terminal connected to a second power supply potential. A method of programming a plurality of programmable elements grouped in a plurality of subgroups each in a respective one of a plurality of groups includes the steps of applying a programming signal to the subgroups in a respective one of the groups and applying an address signal at like respective terminals in each of said groups, with each which terminal there is associated one of said programmable elements, either the programming signal or the address signal being applied by a common switching element.

16 Claims, 4 Drawing Sheets

SEMICONDUCTOR PROGRAMMABLE TEST ARRANGEMENT SUCH AS AN ANTIFUSE ID CIRCUIT HAVING COMMON PROGRAMMING SWITCHES

This application is a continuation of application Ser. No. 08/695,590 filed Aug. 12, 1996, which is hereby incorporated by reference.

BACKGROUND OF THE INVENTION

1. Field of the Invention

The present invention relates to semiconductor integrated circuits having a plurality of programmable elements and lesser pluralities of programming elements and addressing elements involved in the programming of the programmable elements and also to methods for programming the programmable elements.

2. Description of the Related Art

Programmable elements are used, for example, to identify semiconductor wafers and even chips divided therefrom. The programmable elements are typically fuses (open when blown) or 'antifuses' (shorted by applying excessive current to the antifuse).

While very convenient for identification purposes, circuits including antifuses are demanding increasing proportions of the semiconductor device area, which is area taken away from the desired end functions of the circuits. Typically, each antifuse is selected in accordance with an address signal and a program signal that are respectively applied to the gates of an MOS transistor pair associated with each antifuse. A series connection of the transistor pair means that each transistor must provide a wider current path therethrough than would otherwise be necessary, in order to sink sufficient current while the antifuse is blown. The wider current paths mean that the switching devices each occupy a large area on the associated chip in this era of ever-decreasing size for the functional devices of interest.

It therefore would be desirable to decrease the number of such relatively large programming and address elements, while preserving the informational value of the programmable elements.

SUMMARY OF THE INVENTION

The invention is based on the recognition that some of the programming switches in such a circuit can be replaced by a common switch, or that, alternatively, some of the address switches in such a circuit can be replaced by a common switch. While the term 'switch' is used here, it should be understood to be inclusive of the term 'transistor'.

According to the invention, a semiconductor integrated circuit includes a plurality of programmable elements, each having a first terminal connected to a first power supply potential, and a second terminal. Each of a plurality of first semiconductor switching elements has a first terminal respectively connected to the second terminal of a corresponding one of the plurality of programmable elements and has a second terminal. Each of a plurality of second semiconductor switching elements has a first terminal connected in common to selected ones of the second terminals of the plurality of first semiconductor switching elements and has a second terminal connected to a second power supply potential.

In a preferred implementation of the invention, the pluralities of programmable elements and first semiconductor switching elements are arranged in respective pluralities of subgroups such that each subgroup of first semiconductor switching elements is associated with a corresponding subgroup of programmable elements, and each first terminal of the second semiconductor switching elements is connected to the second terminals of a corresponding one of the first semiconductor switching elements within each of the plurality of subgroups of the first semiconductor switching elements.

In another implementation of the invention, the pluralities of programmable elements and first semiconductor switching elements are arranged in respective pluralities of subgroups such that each subgroup of first semiconductor switching elements is associated with a corresponding subgroup of programmable elements, and each first terminal of the plurality of second semiconductor switching elements is connected in common to the second terminals of a corresponding subgroup of the first semiconductor switching elements.

According to another aspect of the invention, a method is provided for programming a plurality of programmable elements grouped in a plurality of groups and subgroups. The method includes the steps of applying a programming signal to the subgroups in a respective one of the groups and applying an address signal at like respective terminals in each of said groups, with each which terminal there is associated one of said programmable elements, either the programming signal or the address signal being applied by a common switching element.

Additional features and advantages of the invention will be set forth in the description which follows and in part will be apparent from the description, or may be learned by practicing the invention. The advantages of the invention will be realized and attained by the apparatus, systems and method particularly pointed out in the following written description, drawings, and claims.

The following detailed description is both exemplary and provides further explanation of the claimed invention. The accompanying drawings also provide a further understanding of the invention and illustrate several embodiments of the invention. Together with the description, the drawings also explain the principles of the invention.

DETAILED DESCRIPTION OF THE ILLUSTRATED EMBODIMENTS

Overview

Figure 1:
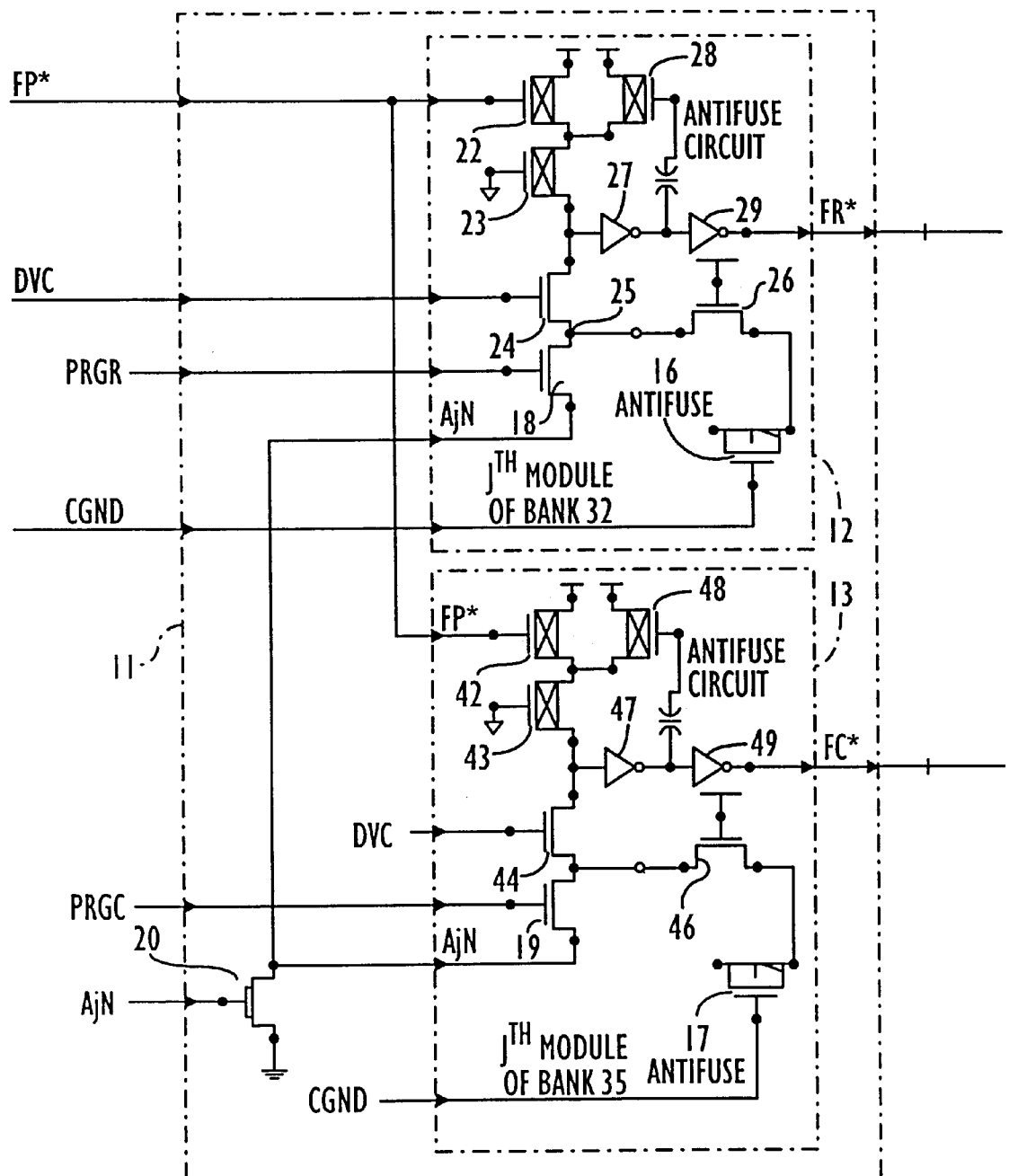
FIG. 1 is a diagram illustrating a preferred embodiment of the invention as applied in two different banks of an antifuse ID circuit.

In the descriptions that follow, like reference numerals refer to like parts in the various figures of the drawings.

In the present invention, each of a plurality of second semiconductor switching elements has a first terminal connected in common to selected ones of a plurality of first semiconductor switching elements to program a programmable element in series to the pair of the first semiconductor switching element and the second semiconductor switching element.

Figure 2:
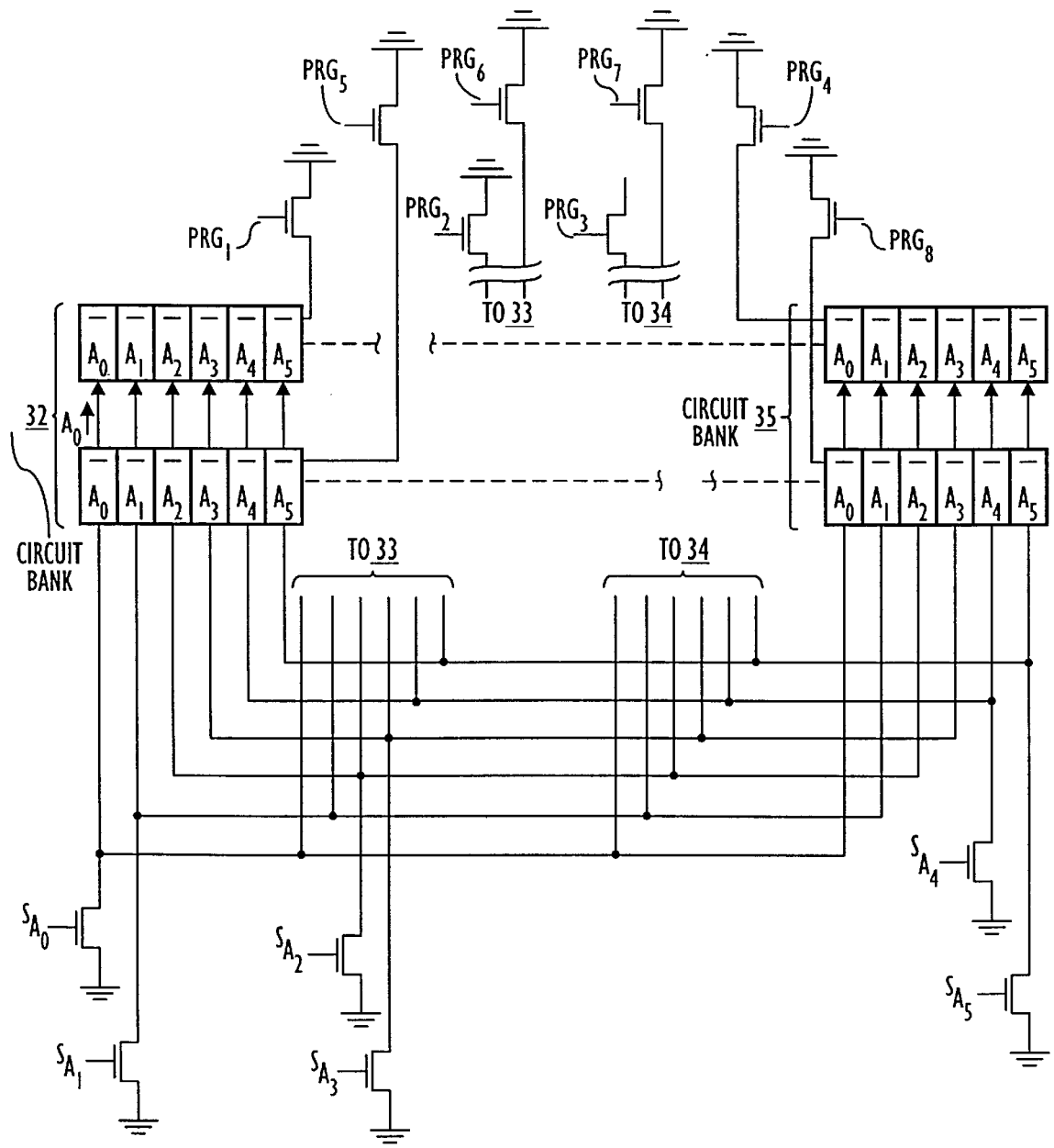
FIG. 2 is a diagram illustrating a more extensive implementation of the embodiment of FIG. 1.

In FIG. 1, antifuse ID circuit 11 includes at least two different banks, for example, 32 and 35 of FIG. 2. Banks 32 and 35 respectively include like '$j^{th}$' modules 12 and 13 shown in more detail in FIG. 1 and each including programmable elements of which antifuses 16 and 17 are illustrative.

To select a particular antifuse 16 for programming by blowing it, a convergence of signals, e.g., a program signal and an address signal is needed.

According to one aspect of the invention as implemented according to FIG. 1, the program signal PRGR and the address signal AjN (where R=1, N=1, and j=1, as illustrated in FIG. 2) are applied through series transistors 18 and 20 to blow antifuse 16. Further, according to this aspect of the invention, the program signal PRGC and the address signal AjN (where C=2, N=2, and j=1) are applied through series transistors 19 and 20 to blow antifuse 17. This common use of transistor 20 to carry the address signal for like modules in different banks is one aspect of the invention. A savings in the number of address transistors and in device area results.

In programming mode, it is the mode CGND that goes high to program the antifuse, the other side of which has been made low by the convergence of programs and address signals. Thus, in programming mode, CGND ('conditional' ground signal) goes high in every module in every bank.

In contrast, in reading mode CGND remains at ground level. Reading signals responsive to the differing antifuses states are obtained.

Above the program transistors 18 and 19 in the showing of FIG. 1 are respective latch circuits. These latch circuits provide the respective output signals FR* and FC* during the reading mode in which the states of the respective antifuses 16 and 17 are read out in response to the reading command signal FP*. Since these circuits are identical (i.e., circuit 13 includes transistors 42, 43, 44 and 48 corresponding to transistors 22, 23, 24 and 28, respectively in circuit 12, as well as inverters 47 and 49 corresponding to inverters 27 and 29) only the latch circuit in module 12 will be described.

During the read mode, FP* goes low to turn on transistor 22 and transistor 24 is turned on by signal DVC. Since the gate of transistor 26 is tied to a power supply, it always remains on. Thus, if antifuse 16 is blown, node 25 will be pulled down to ground. Inverter 27 inverts this low signal to generate a high voltage, which is supplied to the gate of transistor 28, thereby cutting it off. The high output of inverter 27 is also supplied to inverter 29, which outputs a low at FR*.

If, however, the antifuse 16 has not been blown, node 25 is pulled high through transistors 22, 23, 24 and 28, and, therefore FR* goes high. It should be noted, however, that signal DVC is sufficient to turn on transistor 24, but not too strongly. Otherwise, the high potential supplied by p-channel transistors 22 and 28 could blow antifuse 16 during the read.

During the reading mode, transistors 18, 19, and 20 are inactive. The reading circuitry is thus substantially independent of the programming or 'writing' circuitry.

In the more comprehensive organization of FIG. 2, the complete antifuse ID circuit preferably includes four circuit banks 32, 33, 34, and 35, of which only the end ones, 32 and 35, are shown, each including two groups of modules $A_0, A_1, A_2, A_3, A_4, A_5$, and $A_6$. Circuit banks 33 and 34 are identical in details except for the external connections, as shown. Each of the groups of modules is supplied with a common programming signal by a respective programming transistor PRG1, PRG2, PRG3, PRG4, PRG5, PRG6, PRG7, and PRG8. Each of these programming transistors drives an individual programming transistor in each of the modules, in the manner shown in FIG. 1. Like numbered modules are connected together by a single address signal transistor, e.g., transistor $SA_1$, which is transistor 20 in FIG. 1. Cross-connection of adjacent like-numbered modules is indicated by arrows in FIG. 2. Signals $A_0$ to $A_5$ flow through these connections. The cross-connection is accomplished exactly as shown in FIG. 1, for example, as if the adjacent like-numbered modules were modules 12 and 13 of FIG. 1. In the eight groups of modules, there are 48 programmable antifuses.

According to the invention, these 48 antifuses, providing a 48-bit ID number, are programmed using only six address signal transistors, thereby saving 42 transistors as compared to using a separate address transistor in each module, and saving the area on the chip that would be required for these relatively large transistors.

Alternatively, according to a second aspect of the invention, individual selectivity of programming of the programmable elements is retained while reducing the number of programming transistors required for a semiconductor integrated circuit of the programmable ID record type.

Figure 3:
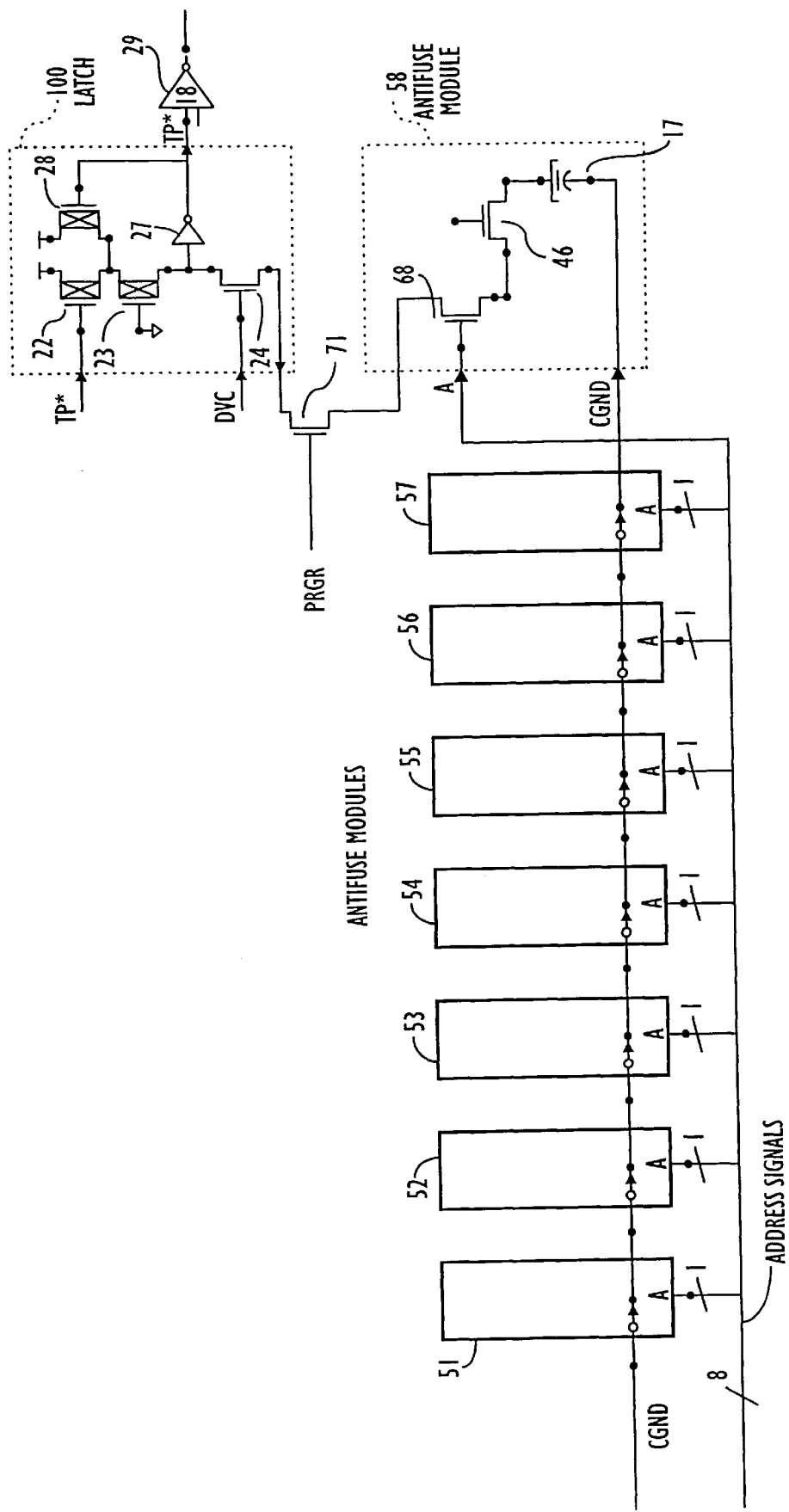
FIG. 3 is a diagram illustrating another embodiment of the invention.

In FIG. 3, an implementation is shown in which a group of fuse or antifuse ID modules that uses only one p-channel latch 100 for the group. Moreover, an individual programming transistor 71 (i.e., a transistor receiving program signal PRG at its gate) can be used to commonly connect the individual antifuse ID modules 51–58 to p-channel latch 100. Alternatively, a programming transistor can be included in each module 51–58. According to this aspect of the invention, however, individual address transistors in each module, such a address transistor 68 in module 58, are used. Only one group of modules is shown in FIG. 3; an additional group of modules is provided for each program signal (e.g., PRGC, etc.). Further, the same address signals are preferably supplied to each group of modules.

Programming mode operation and reading mode operation are similar to those described above for FIG. 1. Whether a simple organization as in FIG. 3 is used, or a more complex organization is used like that in FIG. 2, in terms of numbers of groups of modules, or the number of modules in a group, a large reduction ratio for the number of programming transistors is achieved. For example, a reduction ratio of 1 to 8 is achieved.

Figure 4:
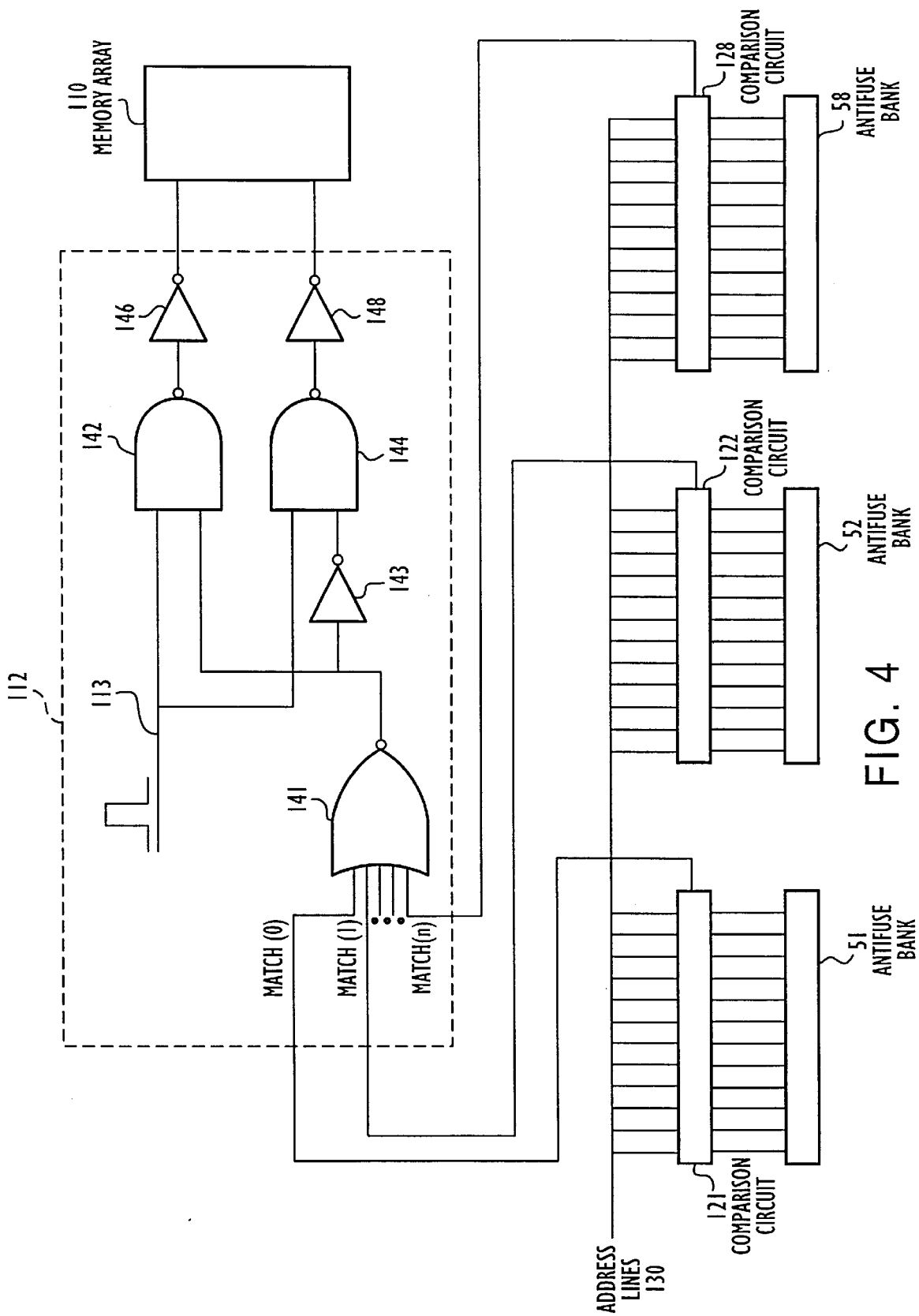
FIG. 4 is a diagram illustrating redundancy progrmming in a memory array in response to the programmable elements.

In FIG. 4, an application of the invention is illustrated in which the programmable elements are programmed to access (interrogate or 'fire') redundant elements in a memory array to avoid elements that are known to be defective This application can employ the first or second embodiments of the invention as described above.

In more detail, FIG. 4 shows a semiconductor integrated circuit, illustratively a memory array 110, to which antifuse banks, illustratively antifuse banks 51, 52, and 58 of FIG. 3, are coupled. Antifuse bank 51 is coupled to memory array 110 by comparison circuit 121 and logic circuit 112. Similarly, antifuse bank 52 is coupled to memory 110 by comparison circuit 122 and logic circuit 112; and antifuse bank 158 is coupled to memory 110 by comparison circuit 128 and logic circuit 112 Memory 110 can be said to be a protected ciruict having both normal and redundant or spare memory cells.

Antifuse banks 51 to 58 store defective memory cell addresses in the form of a unique combination of blown and unblown antifuses. Compare circuits 121, 122 and 128 are respectively coupled to antifuse banks 51, 52 and 58, and output a logic high "match" signal when an input address on address lines 130 matches an address stored in the antifuse banks.

The match signals are supplied to NOR gate 141, which generates a low output whenever one of signals match<0> to match<n> goes high. The low output of NOR gate 141 is inverted by inverter 143 and supplied to NAND gate 144, whereupon receipt of high timing pulse on line 113, the output of NAND gate 144 goes low, and inverter 148 generates a high output to drive or "fire" a redundant element in array 110.

In the absence of any match signals going high, i.e., when a non-defective memory cell is to be accessed, the output of NOR gate 141 is high. Accordingly, a high timing signal on line 113 causes the output of NAND gate 142 to go low. As a result, inverter 146 outputs a high potential, thereby driving a normal element in array 110. Meanwhile, inverter 143 receive the high output from NOR gate 141 and generates a low signal, causing the output of NAND gate 144 to be high. Thus, the output of inverter 148 is low and none of redundant elements within memory array 110 are selected.

The above-described coordination of the signals assures that when a normal memory element is being accessed, access to any redundant memory element is suppressed.

Memory array 110 is merely exemplary of the application circuits included within a semiconductor circuit according to the invention. A logic circuit or other functional circuit could be substituted for memory array 110. Protective switching of a redundant circuit element to replace a defective one could also be provided in the same manner.

In either aspect of the present invention, the ID circuit is made smaller. Driver transistors outside the ID modules can also be made smaller. Likewise, energy efficiency can be improved.

In the method according to the invention, in addition to operations described above with respect to FIG. 1, it is characteristic that the applying steps including the step of applying one of the programming signal and the address signalby a common switching element. Accordingly, one either applies the address signal by a common element or applies the programming signal by a common element. Generally, one does not need to increase the size of the common element in proportion to the ratio by which the number of programming transistors or address transistors is reduced.

The method according to the invention is compatible with programming the programmable elements one by one, two-by two, or in some other multiple set at a time, whether or not redundancy is required. The principle of the invention does not depend on the use of redundancy.

Conclusion

The present invention obtains its advantages because of its use of a common element in a multiplicity of series circuits while allowing a high degree of flexibility in the circuit design. It will be apparent to those skilled in the art that various modifications and variations can be made in the present invention without departing from the spirit or scope of the invention. The present invention covers modifications and variations that come within the scope of the appended claims and their equivalents.

What is claimed is:

1. A method for providing an identification number for an integrated circuit comprising a plurality of programmable banks, each of said programmable banks including a plurality of modules each having a programmable element, said method comprising the steps of:

grouping said plurality of modules into a plurality of subgroups, each of said plurality of subgroups including a respective module from each of said plurality of banks;

applying a respective first signal to each respective module of said plurality of subgroups, said first signal being applied to a single switching element common to each of said plurality of subgroups;

applying a respective second signal to each of said plurality of modules in each of said plurality of subgroups;

applying a programming voltage to said programmable element in each of said plurality of modules, said programming voltage having a magnitude greater than a ground potential; and respectively programming said programmable element in each of said plurality of modules based on said respective first signal, said respective second signal, and said programming voltage to provide said identification number for said integrated circuit.

2. The method according to claim 1, wherein said step of applying a respective first signal further comprises:

turning on said single switching element to connect said each respective module of said plurality of subgroups to a ground potential.

3. The method according to claim 2, wherein said step of applying a respective second signal further comprises:

connecting said programmable element to said ground potential to selectively program said programmable element to a first state; and isolating said programmable element from said ground potential to selectively program said programmable element to a second state.

4. The method according to claim 3, wherein said step of connecting further comprises:

turning on a transistor with said respective second signal to connect said programmable element to said ground potential.

5. The method according to claim 4, wherein said step of isolating further comprises:

turning off said transistor with said respective second signal to isolate said programmable element from said ground potential.

6. The method according to claim 4, wherein said programmable element in each of said plurality of modules is an anti-fuse, and said step of turning on said transistor further comprises:

passing said programming voltage through said anti-fuse to said ground potential to break down a dielectric material in said anti-fuse and program said anti-fuse to said first state.

7. The method according to claim 1, wherein said first signal is an address signal.

8. The method according to claim 5, wherein said second signal is a programming signal.

9. The method according to claim 1, further comprising:

reading said identification number for said integrated circuit by applying a readout voltage to said programmable element in each of said plurality of modules, said readout voltage having a magnitude less than said programming voltage.

10. The method according to claim 1, wherein said first signal is a programming signal.

11. The method according to claim 10, wherein said second signal is an address signal.

12. A method for selectively programming a plurality of programmable elements comprising the steps of:

provviding a programming voltage to a first terminal of each of said plurality of programmable elements, said programming voltage having a magnitude greater than a ground potential;

providing a respective one of a plurality of programming signals to a respective gate of a plurality of transistors, each of said plurality of transistors having a first terminal and a second terminal, said first terminal being coupled to a second terminal of a respective one of said plurality of programmable elements;

providing an address signal to a switching element, said switching element having a first terminal and a second terminal, said first terminal being coupled to said second terminal of each of said plurality of transistors, said second terminal being connected to a ground potential, said switching element turning on to connect said first terminal to said second terminal in response to said address signal; and selectively programming said plurality of programmable elements based on said respective one of said plurality of programming signals.

13. The method according to claim 12, wherein each of said plurality of transistors will selectively conduct based on a first of said plurality of programming signals to connect said second terminal of said respective one of said plurality of programmable elements to said ground potential to thereby program said respective one of said programmable elements.

14. The method according to claim 13, wherein said plurality of programmable elements are anti-fuses, and wherein if a respective transistor is conducting said step of selectively programming further comprises:

passing said programming voltage through a respective anti-fuse, said respective conducting transistor and said switching element to break down a dielectric material in said respective anti-fuse.

15. The method according to claim 12, wherein said switching element is a transistor, and said address signal is applied to a gate terminal of said transistor.

16. The method according to claim 12, further comprising:

reading a state of each of said plurality of programmable elements by applying a readout voltage to each of said plurality of programmable elements, said readout voltage having a magnitude less than said programming voltage.

* * * * *